United States Patent [19]

Atkinson et al.

[11] Patent Number: 4,530,949

[45] Date of Patent: Jul. 23, 1985

[54] HOUSING FOR ELECTRICAL OR ELECTRONIC EQUIPMENT

[75] Inventors: Alan W. Atkinson, Rochdale; David R. Hurst, Oldham; Kenneth T. Somerfield, Stourbridge, all of England

[73] Assignee: T&N Materials Research Limited, Manchester, England

[21] Appl. No.: 632,523

[22] Filed: Jul. 19, 1984

[30] Foreign Application Priority Data

Jul. 30, 1983 [GB] United Kingdom ............... 8320607

[51] Int. Cl.³ .............................................. C08K 3/04
[52] U.S. Cl. .................................... 523/512; 252/511; 523/468; 524/495; 524/594; 174/50
[58] Field of Search ................ 252/511; 523/468, 512; 174/50; 524/594, 495

[56] References Cited

U.S. PATENT DOCUMENTS 3,389,200  6/1968  Olstowski et al. ................ 252/511
3,801,727  4/1974  Wilkinson et al. ................... 174/50
4,382,882  5/1983  Vogel et al. ....................... 252/507

FOREIGN PATENT DOCUMENTS 1411731  10/1975  United Kingdom .
1429576   3/1976  United Kingdom .
2046274A 11/1980  United Kingdom .
2072694A 10/1981  United Kingdom .

*Primary Examiner*—Lewis T. Jacobs
*Attorney, Agent, or Firm*—Cushman, Darby & Cushman

[57] ABSTRACT

A housing for electrical or electronic equipment is made by moulding under heat a composition comprising an organic thermosetting resin which includes exfoliated graphite in an amount which is enough to impart to the moulded article an electrical resistivity not greater than 10 ohm-cm.

The housing has an excellent capacity to reduce the level of electromagnetic radiation emitted by equipment within it and to shield electronic equipment from external electromagnetic radiation.

9 Claims, No Drawings

HOUSING FOR ELECTRICAL OR ELECTRONIC EQUIPMENT

This invention relates to a housing for electrical or electronic equipment.

Housings for electrical or electronic equipment are often made of metal, but manufacturers are now preferring to use plastics materials (eg polycarbonates), for these have the advantage of lower fabrication costs, reduced weight and more flexibility in design. They have, however, the disadvantage that they are virtually transparent to electromagnetic radiation. As the number of radiation sources (such as citizens band radios) grows, and as electronic equipment (microprocessors for example) becomes more complex and so more sensitive to external electromagnetic fields, so it becomes more important to cut down radiation emitted from the one and to shield the other from that electromagnetic radiation which does reach it.

The present invention provides a housing for electrical or electronic equipment which is suitable for the purpose just outlined. The housing is hot-moulded from an organic thermosetting resin moulding composition in which there is included an amount of the material known an exfoliated graphite (sometimes called expanded graphite) which is enough to impart to the moulded article an electrical conductivity equivalent to a resistivity not greater than 10 ohm-centimeter. Because of the structure of exfoliated graphite, as little as 0.5% by weight of it can provide a continuous, electrically conductive network in the moulded article. Preferably, however, the content of exfoliated graphite in the moulding composition is in the range 2.5–20% by weight and a content of 5–20% by weight is particularly preferred.

Exfoliated graphite is a well known material used in the manufacture of gaskets, packings and sealing materials, and is made from natural flake graphite or well ordered synthetic graphite by a process whose first step involves treatment of graphite with a strong oxidising agent. Thus when graphite is treated with sulphuric acid under strong oxidising conditions it swells slightly owing to the interposition, between the layers of hexagonally arranged carbon atoms constituting the graphite lattice, of bisulphate ions $HSO_4^-$ and neutral (unionised) sulphuric acid molecules $H_2SO_4$. If the slightly swollen material is washed with a large volume of water, the intercalated neutral sulphuric acid molecules become replaced by water molecules, but the $HSO_4^-$ ions are largely unaffected. When this compound is free from adherent wash water and heated for a few seconds at temperatures of the order of 1,000° C., the interstitial water suddenly vapourises and causes a great expansion of the compound in the c direction (ie perpendicular to the plane of the carbon atom layers), so that the final c dimension may be 100 times or even more its initial value. Owing to the suddenness of expansion, particles of the expanded substantially sulphate-free product do not possess the highly ordered structure of particles of the original graphite; they are of an irregular form which is usually described as vermiform (worm-like), and are extremely porous. They are also distinct from particles of the oxidised graphite material known as 'graphitic oxide' or 'graphitic acid'.

In spite of their high porosity, particles of exfoliated graphite are not particularly fragile; they are indeed much less fragile than the hollow carbon microspheres whose inclusion in electromagnetic radiation absorption material is described in British patent specification No. 1 411 731. Such microspheres are expensive to make, and their spherical structure requires them to be used in considerably higher proportion in a non-conductive matrix in order to obtain a composite with an electrical conductivity equal to that imparted by a given content of exfoliated graphite. Thermosetting resin compositions which include hollow carbon micro-spheres in a proportion adequate to give electrical conductivity suitable for our purposes are in fact very difficult to mould because of their low plasticity.

The thermosetting resins preferably used are phenolic resins, particularly phenol formaldehyde resins, and unsaturated polyester resins, but epoxy resins, urea formaldehyde resins and melamine formaldehyde resins can be used if desired. Ordinarily, the organic thermosetting resin will form at least 20% by weight of the moulding composition, but not more than 95% by weight thereof. The balance of the moulding composition is essentially non-conductive moulding additive such as reinforcing fibre and non-fibrous filter. There may be up to 60% by weight of reinforcing fibre, and up to 60% by weight of filler. Other moulding additives such as catalyst, inhibitor and mould release agent may be employed in an amount not greater than about 10% by weight.

The invention is further illustrated by Examples 1 to 3 later, which utilise as starting material an exfoliated graphite which is conveniently prepared as follows:

PREPARATION OF EXFOLIATED GRAPHITE

Natural flake graphite (10 gms; 99% carbon; 80% retained on a sieve of aperture 300 μm diameter) was gently stirred for ½ hour with a mixture (90 gms; added at room temperature) of sulphuric acid, nitric acid and water, in weight proportion such that $H_2SO_4:HNO_3:H_2O = 74:15:11$.

The reaction mixture was filtered off and the graphite compound formed by reaction (probably $C_{24}^+.HSO_4^-.nH_2SO_4$), was washed until substantially free from the molecular species $H_2SO_4$ by running water at room temperature (20° C.) for one hour. The fully washed material was drained from adherent water and dried at 80° C. for 3 hours, and then conventionally flame exfoliated (temperature 1200° C.) to volatilise the bound water content. The exfoliated product had a density of about 4 kg/m$^3$ (0.004 gm/cm$^3$).

To avoid the difficulties of handling very large volumes of such low-density material, it may be convenient to compact the product, to a density not greater than 75–100 kg/m$^3$.

EXAMPLE 1

Exfoliated graphite (40 g) was gently compacted into a slab of density 18 kg/m$^3$ and the slab was laid in a pool (2040 g) of alcoholic solution of phenolic resole resin (viscosity 60 centistokes at ambient temperature) containing 25% by weight solids. When the slab had absorbed all the liquid it was broken down in a mixer to form crumbs of 2–10 mm maximum dimension, and chopped glass fibre (6 mm long; 240 g) having a dressing compatible with the phenolic resin was blended in. After 15 minutes the mixture was transferred to an oven and held at 105° C. for 100 minutes to evaporate the solvent and part-cure the resin.

The solvent-free part-cured mixture was then transferred to a heated mould and press-cured at 170° C. for one hour to form a housing with walls 3.5 mm thick, of density 1500 kg/m$^3$ and resistivity 0.18 ohm-cm.

The capacity of the material of the housing to reduce transmission of electromagnetic radiation at various frequencies was investigated as follows:

A panel of the material was mounted over a square aperture of size 25 cm cut in the side of a wall of a room otherwise well shielded. A range of signal generators with appropriate transmitter antennae was placed outside the room, facing the aperture, and matched receivers were mounted inside the room, facing the aperture. Transmitter, receiver and antennae combinations were selected to permit measurements over frequencies in the range 50-1000 MHz.

By measuring received signal levels at selected frequencies, with and without the test panel in place over the aperture, the attenuation characteristics of the panel were determined over the stated frequency range. The measured attenuation was 32-64 dB, as set out below. (Attenuation of 20-40 dB is regarded as satisfactory for most domestic and commercial equipment.)

| Frequency (MHz) | Attenuation (dB) |
| --- | --- |
| 960 | 64 |
| 700 | 64 |
| 450 | 64 |
| 200 | 56 |
| 100 | 52 |
| 50 | 32 |

Mechanical properties of the moulded material forming the housing were:

| | |
| --- | --- |
| Tensile strength (Mpa) | 13 |
| Tensile modulus (Gpa) | 8 |
| Flexural Strength (MPa) | 46 |
| Flexural Modulus (GPa) | 7 |
| Izod impact strength (noched edgewise) (J/m) | 80 |

EXAMPLE 2

The following ingredients were tumble mixed for 10 minutes:

| | A | B |
| --- | --- | --- |
| Exfoliated graphite (compacted to bulk density 11 kg/m$^3$) | 50 g | 100 g |
| Chopped Glass fibre (3 mm long) | 550 g | 500 g |
| *Powdered phenolic resin | 400 g | 400 g |
| Calcium stearate (mould release agent) | 15 g | 15 g |

*Novolac resin admixed with 12% by weight of hexamine; melt viscosity = 82 kpoise min. at 136° C.

Each of mixtures A and B was press-cured (moulding pressure 4-16 MN/m$^2$) for one hour at 170° C. in a heated mould to give a housing of wall thickness 3.5 mm and density about 1750 kg/m$^3$. Other properties of the press-cured materials were:

Electromagnetic radiation shield capacities:

| Frequency (MHz) | Attenuation (dB) | |
| --- | --- | --- |
| | A | B |
| 10000 | 120 | 140 |
| 960 | 72 | 100 |
| 700 | 70 | 100 |
| 450 | 64 | 110 |
| 200 | 58 | 90 |
| 100 | 44 | 85 |
| 50 | 32 | 55 |
| Tensile strength (MPa) | 45 | 39 |
| Tensile modulus (GPa) | 14.3 | 12 |
| Flexural strength (MPa) | 108 | 73 |
| Resistivity (ohm-cm) | 0.35 | 0.07 |

EXAMPLE 3

The following ingredients were mixed in a Z-blade mixer:

| | |
| --- | --- |
| Exfoliated graphite (compacted to bulk density 11 kg/m$^3$) | 100 g |
| Polyester resin solution in styrene (2 parts by weight of polyester derived from propylene glycol, maleic acid and phthalic anhydride; 1 part by weight of styrene) followed by | 700 g |
| Polyvinylacetate solution in styrene (1:1) (low profile additive) | 200 g |
| Conventional catalyst and inhibitor mixture followed by | 10 g |
| Chalk (filler; average particle size 3 μm) | 770 g |
| Calcium stearate (mould release agent) followed by | 30 g |
| Glass fibre (6 mm long; with polyester-compatible dressing) | 200 g |

After a total of 20 minutes mixing, the material was transferred to a heated mould and press-cured at 130° C. for 1½ minutes to form a housing of wall thickness 4 mm and density 1590 kg/m$^3$. Its resistivity was 0.5 ohm-cm.

Its capacity to reduce transmission of electromagnetic radiation at various frequencies was:

| Frequency (MHz) | Attenuation (dB) |
| --- | --- |
| 10000 | 106 |
| 960 | 50 |
| 700 | 50 |
| 450 | 54 |
| 200 | 48 |
| 100 | 32 |
| 50 | 26 |

Mechanical properties of the material of the housing were:

| | |
| --- | --- |
| Tensile strength (MPa) | 18 |
| Tensile Modulus (GPa) | 8 |
| Flexural strength (MPa) | 50 |
| Flexural modulus (GPa) | 8 |
| Izod impact strength (notched) (J/m) | 166 |

We claim:

1. A housing for electrical or electronic equipment made by moulding under heat a composition comprising an organic thermosetting resin which contains an amount of heat-exfoliated porous graphite of density below 100 kg/m$^3$, said amount being sufficient to impart to the moulded article an electrical resistivity not greater than 10 ohm-cm and forming 0.5 to 20% by weight of the composition.

2. A housing according to claim 1, in which the amount of exfoliated graphite forms 2.5 to 20% by weight of the composition.

3. A housing according to claim 1, in which the amount of exfoliated graphite forms 5 to 20% by weight of the composition.

4. A housing according to claim 1, in which the organic thermosetting resin forms 20–95% by weight of the composition.

5. A housing according to claim 3, in which the composition contains up to 60% by weight of reinforcing fibre.

6. A housing according to claim 3, in which the composition contains up to 60% by weight of non-fibrous filler.

7. A housing according to claim 1 in which the thermosetting resin is a phenolic resin.

8. A housing according to claim 1 in which the thermosetting resin is an unsaturated polyester resin.

9. A housing for electrical or electronic equipment made by moulding under heat a composition consisting essentially of an organic thermosetting resin which contains an amount of heat-exfoliated porous graphite of density below 100 kg/m$^3$, said amount being sufficient to impart to the moulded article an electrical resistivity not greater than 10 ohm-cm and forming 0.5 to 20% by weight of the composition.

* * * * *